United States Patent [19]

Falk

[11] Patent Number: 4,999,486

[45] Date of Patent: Mar. 12, 1991

[54] OPTOELECTRIC LOGIC ARRAY

[75] Inventor: R. Aaron Falk, Renton, Wash.

[73] Assignee: The Boeing Company, Seattle, Wash.

[21] Appl. No.: 414,004

[22] Filed: Sep. 29, 1989

[51] Int. Cl.⁵ .......................................... H01J 31/50
[52] U.S. Cl. .............................. 250/213 A; 377/102
[58] Field of Search ............... 250/213 A, 551, 208.2; 307/311; 364/837, 845, 846; 377/102

[56] References Cited

U.S. PATENT DOCUMENTS

| | | | |
|---|---|---|---|
| 3,321,631 | 5/1967 | Biard et al. | 250/551 |
| 3,348,064 | 10/1967 | Powlus | 307/88.5 |
| 3,413,480 | 11/1968 | Biard et al. | 250/551 |
| 3,655,988 | 4/1972 | Nakamura et al. | 250/211 J |
| 3,680,080 | 7/1972 | Maure | 250/213 A |
| 3,818,451 | 6/1974 | Coleman | 250/551 |
| 3,995,173 | 11/1976 | Sibley | 250/551 |
| 4,506,151 | 3/1985 | MacDonald et al. | 250/213 A |
| 4,546,244 | 10/1985 | Miller | 250/211 J |
| 4,689,793 | 8/1987 | Liu et al. | 307/311 |
| 4,731,528 | 3/1988 | Neumann et al. | 250/213 A |
| 4,760,249 | 7/1988 | Baskett | 250/213 A |
| 4,771,169 | 9/1988 | Boatmun | 250/213 A |
| 4,797,843 | 1/1989 | Falk et al. | 364/713 |

Primary Examiner—David C. Nelms
Attorney, Agent, or Firm—Foley & Lardner, Schwartz, Jeffery, Schwaab, Mack, Blumenthal & Evans

[57] ABSTRACT

The invention comprises a semiconductor substrate with a plurality of photoconductive elements. The photoconductive elements are connected to form combinational logic gates. An optic substrate overlies the semiconductor substrate and directs light representing logic parameters onto the logic gates. The combinational logic gates have complementary inputs and complementary outputs such that combinational logic can be carried out using only AND and OR gates.

24 Claims, 7 Drawing Sheets

OPTOELECTRIC LOGIC ARRAY

BACKGROUND OF THE INVENTION

1. Field of the Invention

This invention relates to optoelectronic logic and especially to such logic which avoids the use of inverters.

2. Discussion of Related Art

There is a fundamental difference between optical circuits, in which the information carriers are photons, and electronic circuits, where the carriers are electrons. In the former case the carriers do not interact with each other, while in the latter they do. This means that in optical devices there exist interconnect possibilities that do not exist with electronic hardware, in particular, interconnected parallel architectures which permit digital arithmetic and logic operations to be performed in a completely parallel, single step process. After the inputs are switched on, the output appears in the time it takes a photon to transit the device. No faster computation time is possible.

Optoelectronic logic circuits have been suggested in the past. For example, MacDonald et al. U.S. Pat. No. 4,506,151 discloses logic circuits which employ photoresponsive field effect transistors to directly drive laser diodes to provide optical output signals in response to optical input signals. However, such known optoelectronic circuits suffer from the defect that electronic inverters are used. The use of inverters limits the depth of logic that can be obtained before a conversion back to optics is necessary.

SUMMARY OF THE INVENTION

An object of the present invention is to provide an optoelectric logic circuit using logic variables and their complements to allow a complete logic set to be produced from AND gates and OR gates followed by a single back conversion to optics. This permits a depth and complexity of logic which is limited primarily by signal to noise considerations.

Another object of the present invention is to provide a combinational logic circuit using photoconductive detectors with very low capacitance, large dynamic range and high speed.

Another object of the present invention is to provide a combinational logic circuit which uses photoconductive detectors employing bipolar currents so that the device operates at the same switching speed independent of the depth of the logic.

In accordance with the above and other objects, the present invention includes a semiconductor substrate, element defining structure for defining a plurality of photoconductive elements in the semiconductive substrate, connecting structure for connecting the photoconductive elements to form combinational logic gates, light directing structure positioned above the semiconductor substrate for directing light representing logic parameters to the logic gates, wherein the combinational logic gates have complementary inputs and complementary outputs such that combinational logic can be carried out using only AND and OR gates.

The element defining structure and the connecting structure may comprise a metallization layer over the semiconductor substrate. The light directing structure comprises an optical substrate having a plurality of waveguides over the metallization layer. The waveguides include scattering patches positioned over certain of the logic gates.

The element defining structure comprises a pair of spaced metal electrodes having interdigitated fingers. The metal electrodes are spaced by a distance of less than 5 microns.

The connecting structure connects a plurality of the photoconductive elements in series to form an AND gate. The connecting structure also connects a plurality of the photoconductive elements in parallel to form an OR gate. Alternatively, OR gates can be formed by providing multiple optical inputs to a single photoconductive element.

The complementary outputs may include paired light emitting elements.

The light directing structure may include inputs for parameters, complements of parameters and control signals. The control signals are directed to photoconductive elements in series with combinational logic gates to control their outputs. In this manner, a programmable logic array is provided.

The present invention may also be characterized as a method carried out in an optoelectric combinational logic circuit having photoelectric elements connected to form AND and OR gates of illuminating the photoelectric elements with optical signals representing input parameters and their complements, and producing output signals representing output parameters and their complements based on the combinational logic.

BRIEF DESCRIPTION OF THE DRAWINGS

The invention will become more clearly understood from the detailed description below, with reference to the accompanying drawings, in which like reference numerals are used to indicate similar components throughout, and in which.

DETAILED DESCRIPTION OF THE PREFERRED EMBODIMENTS

Figure 1:
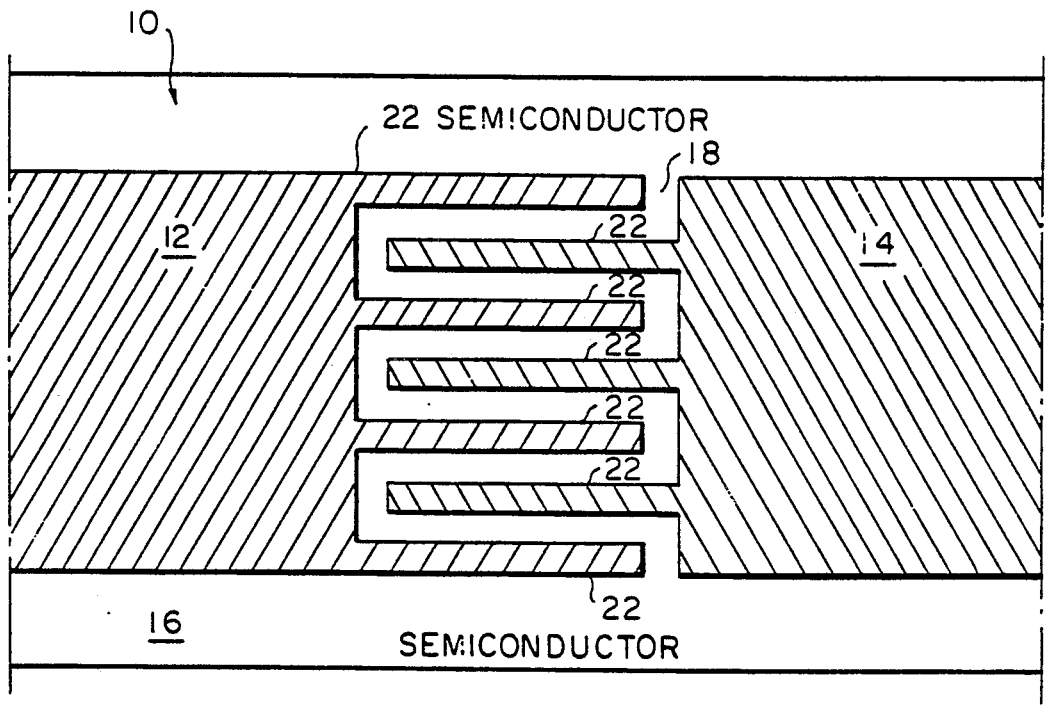
FIG. 1 is top plan view of one photodetector element according to the present invention.
Figure 2:
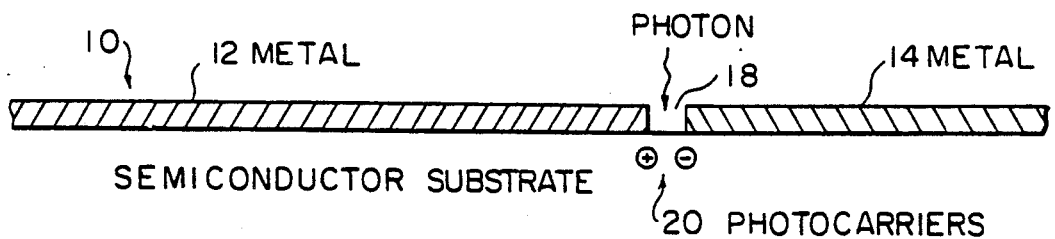
FIG. 2 is a cross sectional view of the photodetector element of FIG. 1.

One purpose of the present invention is to provide a highly efficient optoelectronic logic array. The basic building block for this array is shown in FIGS. 1 and 2. Shown here is a metal-semiconductor-metal (MSM) photoconductive detector 10. The detector 10 comprises metal electrodes 12 and 14 on the surface of a semiconductor substrate 16. Electrodes 12 and 14 can be formed of aluminum or any other suitable material. Substrate 16 can be silicon, germanium, gallium arsenide or any other suitable material. The electrodes 12 and 14 are spaced by a small gap 18, which can be on the order of a few microns. This gap is illuminated with light to produce electron-hole pairs, resulting in a bipolar current when the electrodes 12 and 14 are biased. In order to obtain a large collection area for the detectors, each electrode has a plurality of fingers 22 which are interdigitated.

MSM's have demonstrated switching speeds in the picosecond regime. And, these devices operate with bipolar current. These factors enable logic arrays to be produced in which each gate has the same switching speed independent of the depth of the logic and therefore allow the realization of logic arrays having a complexity limited primarily by signal-to-noise consideration. Furthermore, MSM's are relatively simple to fabricate. Consequently, as far as speed and simplicity of fabrication are concerned, MSM's are the best choice for optoelectronic logic arrays.

Figure 3:
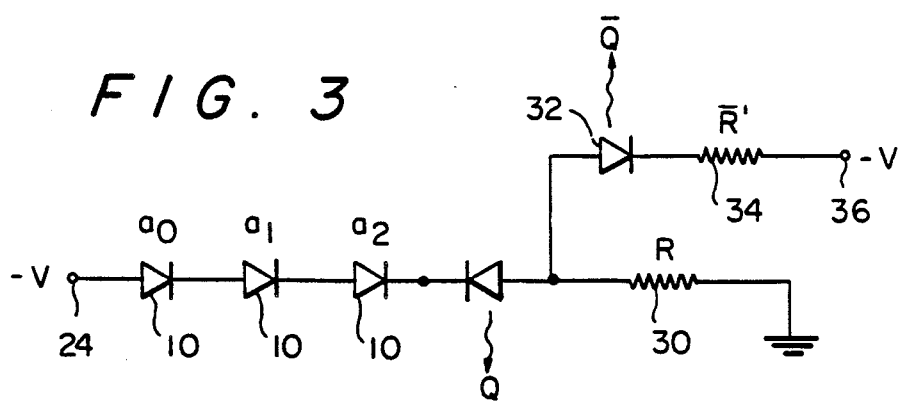
FIG. 3 is a schematic of a multiple input AND gate according to the present invention.

In order to use the detectors 10 shown in FIG. 1, they must be strung together in series or parallel circuits. FIG. 3 shows a series string of detectors 10. These detectors are illuminated by optical inputs a0, a1 and a2. The string will only have a low resistance when all the photoconductors in the string are illuminated and thereby constitutes a multi-input AND gate.

Figure 4:
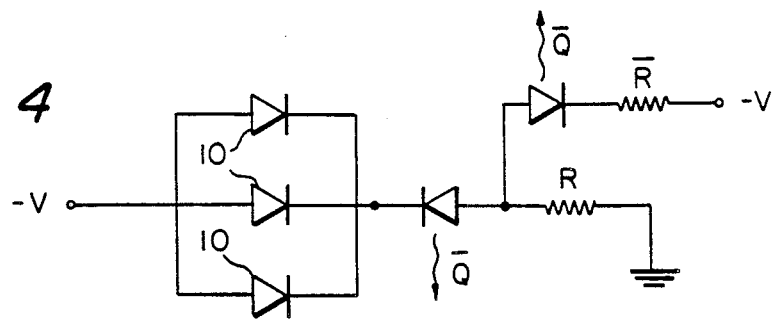
FIG. 4 is a schematic of a multiple input OR gate according to the present invention.

FIG. 4 shows a parallel set of three detectors 10 which will have a low conductance if any of the photoconductors is illuminated. This set, therefore, constitutes a multi-input OR gate. A multi-input OR gate can also be realized by directing multiple optical inputs to a single detector. The mixing of AND and OR gates results in combinational logic.

Figure 5:
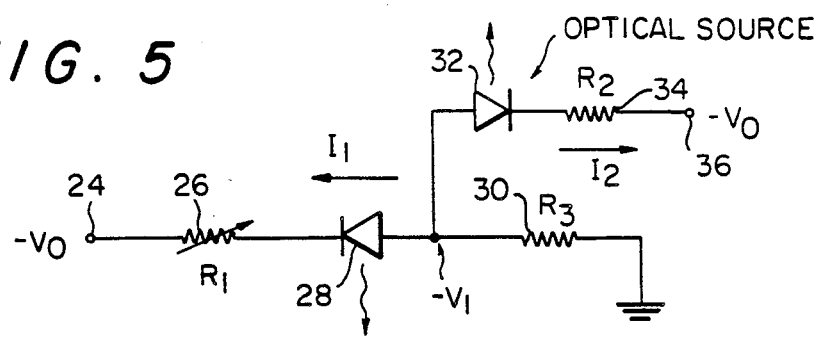
FIG. 5 is a schematic demonstrating the operation of a first embodiment of a complementary output used in the present invention.

As discussed above, one goal of the present invention is to perform combinational logic as rapidly as possible. This is in part achieved by using a minimum number of electrical switching elements which inherently require delay and limit the depth of permissible logic before a back conversion to light is required. In order to avoid switching circuits to provide an inverted parameter, complementary logic is used. In this manner, the complements of all parameters are available at all times. This requires that complementary inputs and outputs be used between the circuits. FIG. 5 shows one circuit for producing such complementary outputs and inputs.

The circuit of FIG. 5 includes a voltage source 24, a variable resistor 26, a first electrical to light conversion element 28 connected in series with the resistor 26, and a second resistor 30 connected between the electrical to light conversion element 28 and ground. A second electrical to light conversion element 32 is connected in series to a third resistor 34 between a voltage source 36 and the junction between resistor 30 and electrical to light conversion element 28. The electrical to light conversion elements can be LEDs, laser diodes, modulators, or any other suitable device as would be apparent to one skilled in the art. The voltage sources 24 and 36 have the same negative value relative to ground.

In operation, as the value of resistor 26 is varied, the values of currents I1 and I2 are also varied. With the value of resistor 26 being R1, the value of resistor 34 being R2 and the value of resistor 30 being R3, it will be understood that as R1 becomes much greater than R2 and R3, the current through conversion element 28, I1, will be reduced to zero and the current through conversion element 32, I2, will increase. Thus, conversion element 32 will illuminate and conversion element 28 will extinguish. Just the opposite is true if R1 becomes much smaller than R2 and R3. That is, in this case, current I1 will increase illuminating conversion element 28 and current I2 will go to zero extinguishing conversion element 32.

Returning to FIG. 3, it will be understood that in the optoelectronic circuit of the present invention, a combinational logic circuit comprising detectors 10 is substituted for the resistor 26. Thus, the illuminated states of the conversion elements 28 and 32 represent complementary outputs of the combinational logic.

Figure 6:
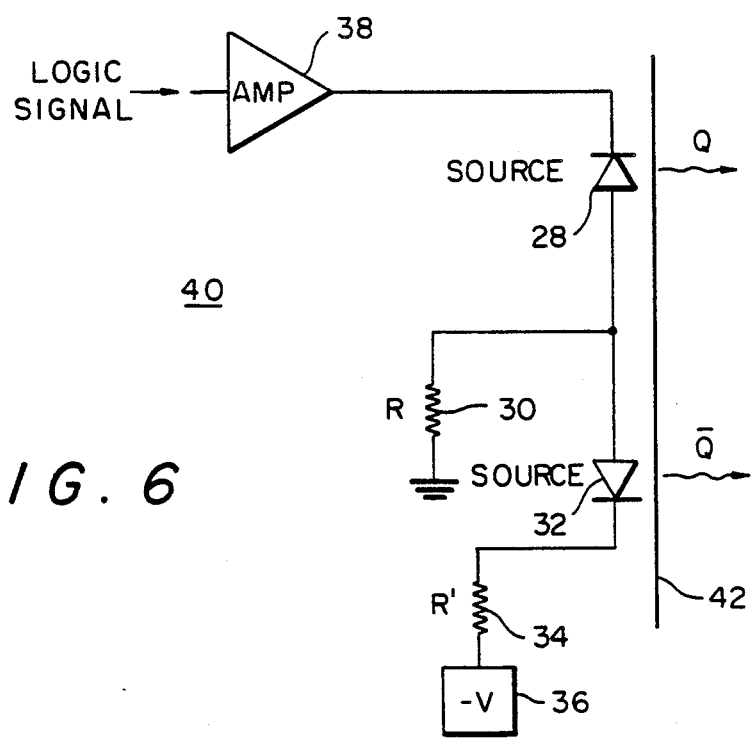
FIG. 6 is a schematic depicting an edge output used in the present invention.

FIG. 6 shows one possible orientation of the output for a logic circuit according to the invention. The circuit itself is represented by a logic signal supplied to an amplifier contained in an integrated circuit chip 40. This circuit must be interfaced with other chips containing other logic circuits, with busses, etc. As shown in FIG. 6, to conserve space the output from the electrical to optical conversion devices 28 and 32 is taken along the edge 42 of the chip 40 by placing the elements 28 and 32 adjacent to this edge. Clearly, the next circuit, buss, etc. could receive the signals along its edge also.

Figure 7:
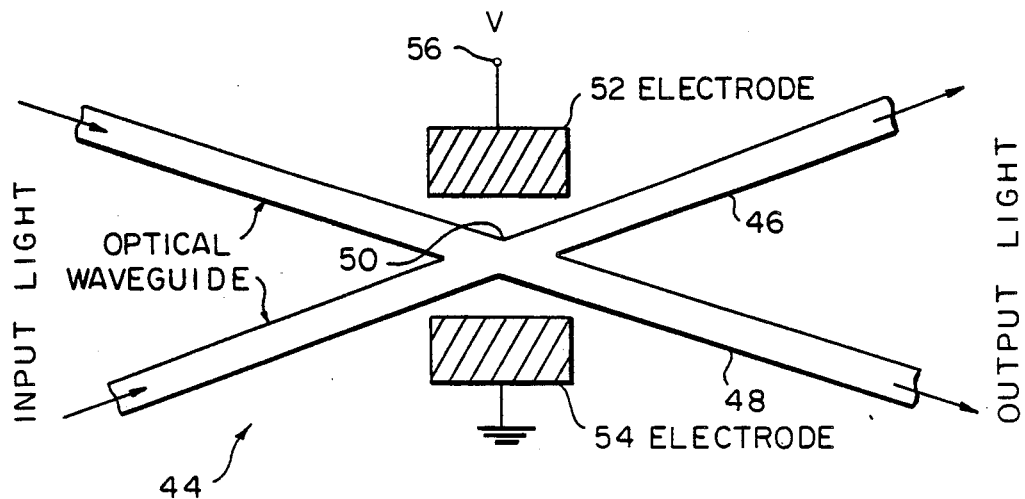
FIG. 7 is a schematic showing an optical switch which can be used to produce a complementary output.

FIG. 7 shows an alternative configuration for producing complementary outputs. This embodiment comprises an integrated electro-optic switch which can be either an X-crossing for single mode operation or a total internal reflectance (TIR) switch for multimode operation. Such switches are well known, per se. The embodiment shown in the drawings comprises a pair of waveguides 46 and 48 crossing at a junction 50. Electrodes 52 and 54 are positioned at the junction 50 and control the path of light input at one end of waveguide 48. Based on the input voltage 56 at electrode 52, electrode 54 being grounded, the light is output through waveguide 46 or waveguide 48. The input voltage 56 is the output of a combinational circuit so that the output from the waveguides 46 and 48 represent complementary outputs from the combinational logic.

Figure 8:
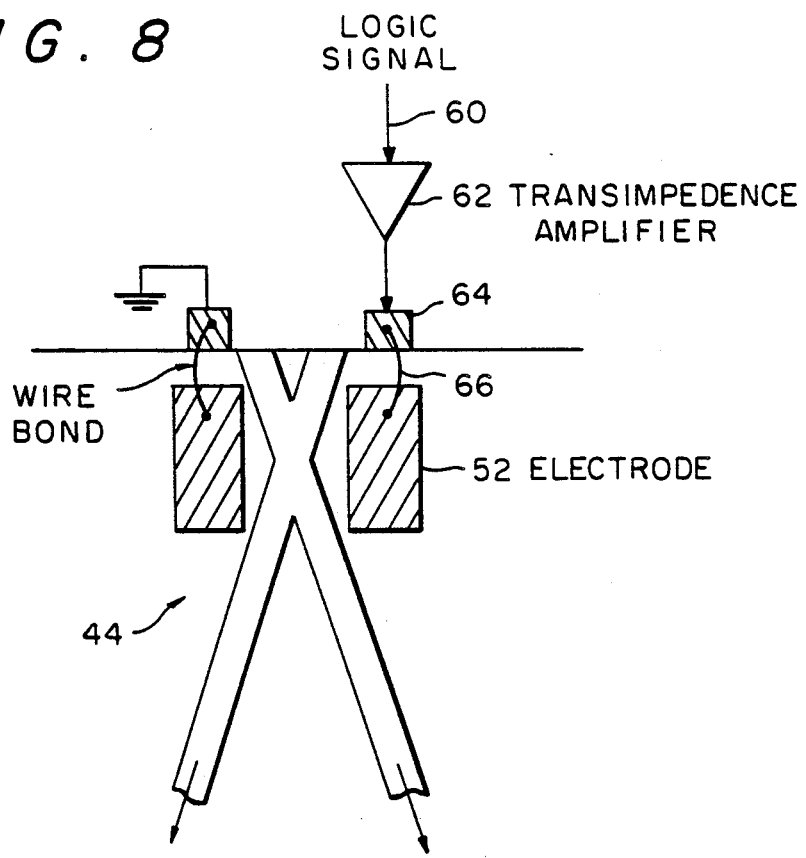
FIG. 8 is a schematic showing the interface of the optical switch of FIG. 7 with a logic circuit according to the present invention.

FIG. 8 shows one way to interface the switch 44 with a combinational logic circuit. The logic signal is transmitted along line 60 and this current signal is turned into a voltage signal in transimpedance amplifier 62. The signal is then passed through bonding pad 64 and wire bond 66 to electrode 52.

Figure 9:
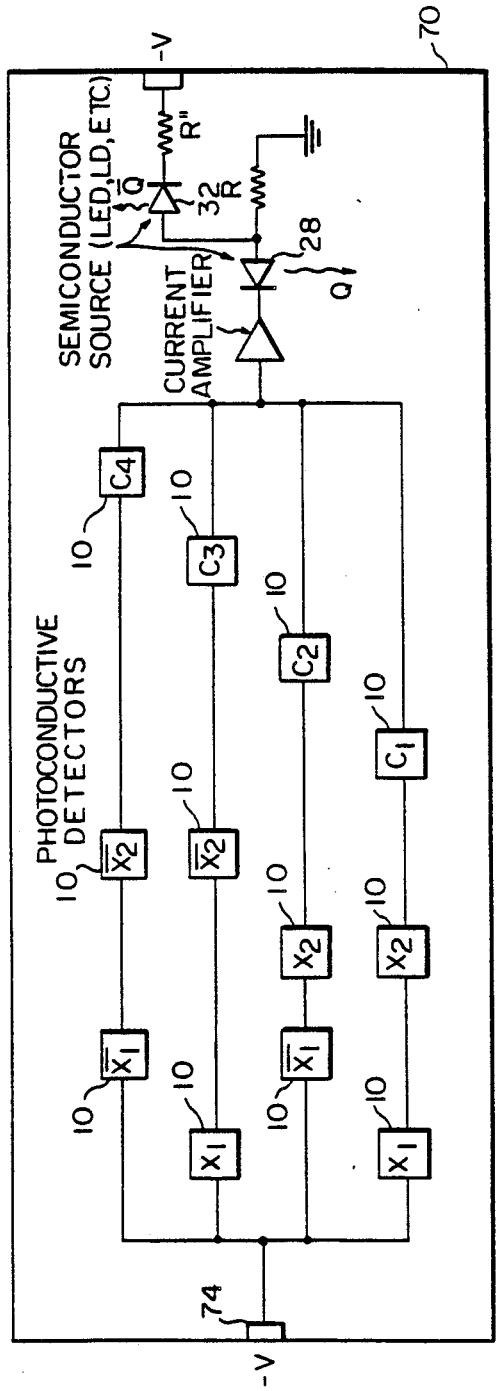
FIG. 9 is a schematic plan view of an optoelectronic substrate used in the present invention.
Figure 10:
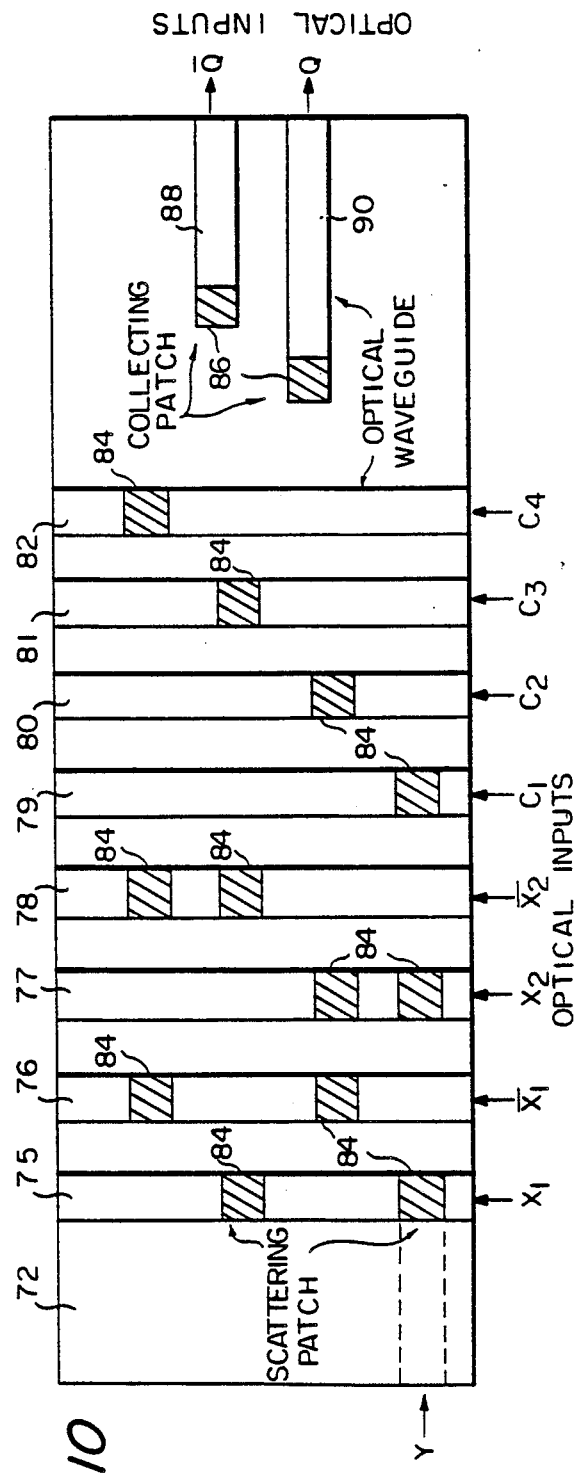
FIG. 10 is a schematic plan view of an optical substrate used in the present invention.

FIG. 9 shows an optoelectronic substrate 70 for the realization of a programmable boolean logic array according to the invention on a planar chip package. This substrate contains any sources, detectors and current amplifiers needed. FIG. 10 shows an optical substrate 72 which is positioned over the optoelectronic substrate 70 to form a complete logic array. This substrate contains waveguides and scattering patches for inputting light signals to the substrate 70, as will become apparent from the discussion below.

As seen in FIG. 9, the substrate 70 includes a bonding pad 74 connected to a voltage source providing a negative voltage to each of a plurality of parallel lines containing photoconductive detectors 10. Each detector 10 represents a different parameter as indicated on the drawing. For example, in the first line the first two series connected detectors represent the variables X1 and X2 and a third detector represents a control parameter C1. The control parameter C1 receives a control input to make the logic array programmable. In other words, if the first line is to be used in the logic array, an input is provided to control parameter C1. In like manner, the second line has a control parameter C2, the third line has a control parameter C3 and the fourth line has a control parameter C4. The output is taken through a complementary electrical to optical output circuit as described in FIG. 5 and FIG. 6.

As is apparent from FIG. 9, the variable parameters represented are X1, X2 and their complements. The four lines represent four possible combinations of these parameters. Such a substrate can be prepared for any number of variables and any combination of variables making full programmability possible. The lines are arranged in a linear (noncrossing) arrangement which allows for high speed microwave stripline type fabrication.

Optical inputs to photodetectors 10 are provided through the substrate 72 which has a plurality of optical waveguides 75-82. Each waveguide receives an optical signal representing one of the parameters X1, X2, their complements and each of the control parameters.

Each waveguide includes an optical scattering patch 84 positioned to input the appropriate light signal to the appropriate underlying photodetector 10. In other words, the two scattering patches 84 in the column representing the parameter X1 overly the photodetectors representing this same parameter. A similar situation holds for the scattering patches in the other columns and photodetectors representing the other parameters.

The operation of scattering patches in optoelectronic circuits is disclosed in U.S. patent application Ser. No. 07/219,276 filed July 15, 1988, the disclosure of which is incorporated herein by reference. A reversible form of scattering patch 86 allows coupling of the electrical to optical conversion devices 28 and 32 back into the optical substrate 72. Waveguides 88 and 90 then provide complementary optical output signals. If this type of arrangement is undesirable, the sources 28 and 32 can be positioned to emit from the side of the substrate, as discussed above relative to FIG. 6. Another alternative is the use of a transimpedance amplifier and a suitable integrated optical switch as discussed above in connection with FIGS. 7 and 8. This switch could be integrated into the optical substrate 72 and the electrodes could be connected to the optoelectronic substrate 70 using indium bump technology. Another alternative is to use a third substrate with wire bonds performing the electrical connections as shown in FIG. 8.

As mentioned above, an alternate realization of an OR gate comprises multiple light inputs directed to a single photoelectric element. This can be accomplished by directing multiple waveguides to the same scattering patch 84. An example of this technique is shown in phantom FIG. 10 where a second input Y is directed to the same scattering patch 84 as input $X_1$, resulting in the O-ring of $X_1$ and Y.

Figure 11:
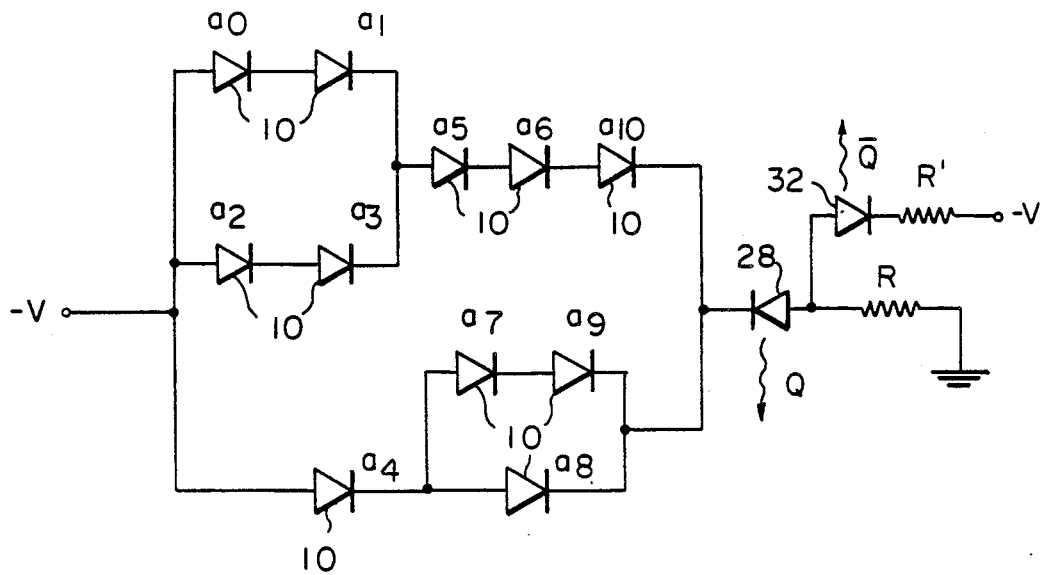
FIG. 11 is a schematic view of a multiple input optoelectronic combinational logic according to the present invention.

FIG. 11 is a schematic diagram of a particular logic circuit according to the present invention. This circuit is a realization of the logic function:

$$((a0\ a1+a2\ a3)\ (a5\ a6\ a10))+a4\ ((a7\ a9)+a8)$$

where a1-a10 indicate input parameters. As will be understood, the circuit of FIG. 11 can be formed using substrates similar to those in FIGS. 9 and 10.

Figure 12:
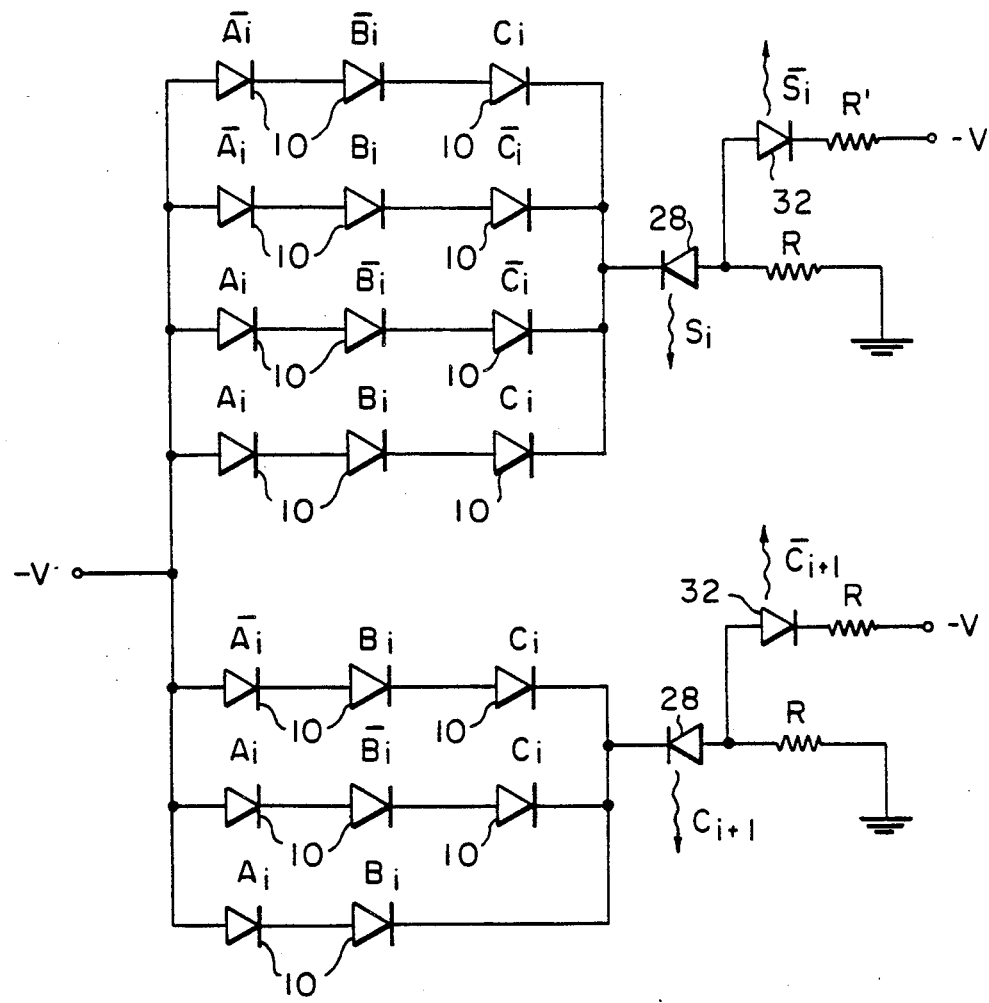
FIG. 12 is a schematic view of a 1 bit full adder according to the present invention.

FIG. 12 shows a one bit full adder realized using the present invention. Here, the bits to be added are Ai and Bi. Ci indicates a carry bit. The result of the addition is the sum Si and the carry forward is indicated by the bit $Ci+1$. As with the circuits described above, this is a full complementary circuit which outputs the sum Si and its complement as well as the carry bit $Ci+1$ and its complement. Again, substrates similar to those in FIGS. 9 and 10 can be used to form this circuit. As is apparent from the foregoing, it is a straightforward matter to determine the boolean equation describing this circuit.

Figure 13:
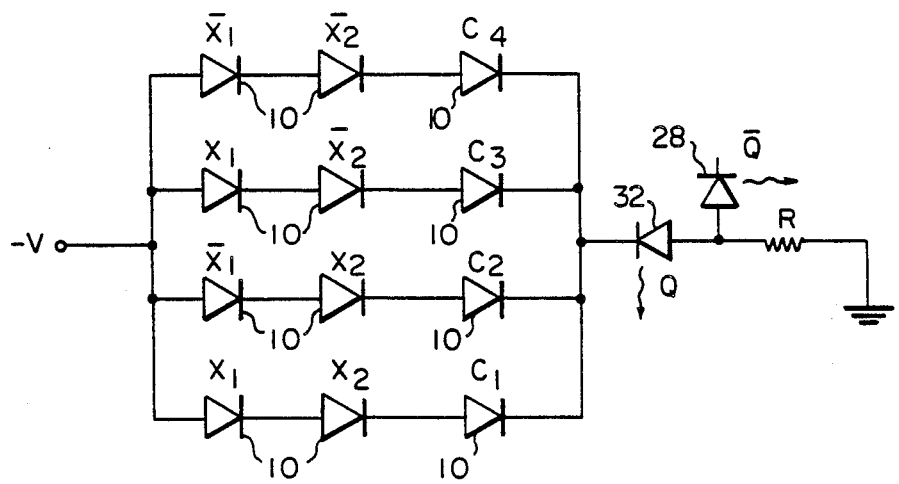
FIG. 13 is a schematic view of a programmable Boolean gate according to the present invention.

FIG. 13 is a schematic representation of the circuit of FIGS. 9 and 10. Here, it can easily be seen that, if there are to be no crossed lines, the actual construction of a circuit must include a separate optical strip for each parameter and its complement. That is, in the schematic diagrams, the parameters and their complements are shown in the same vertical column. Separate columns are needed in the actual physical realization of the circuit, as is apparent by comparing FIG. 13 with FIG. 10.

Figure 14:
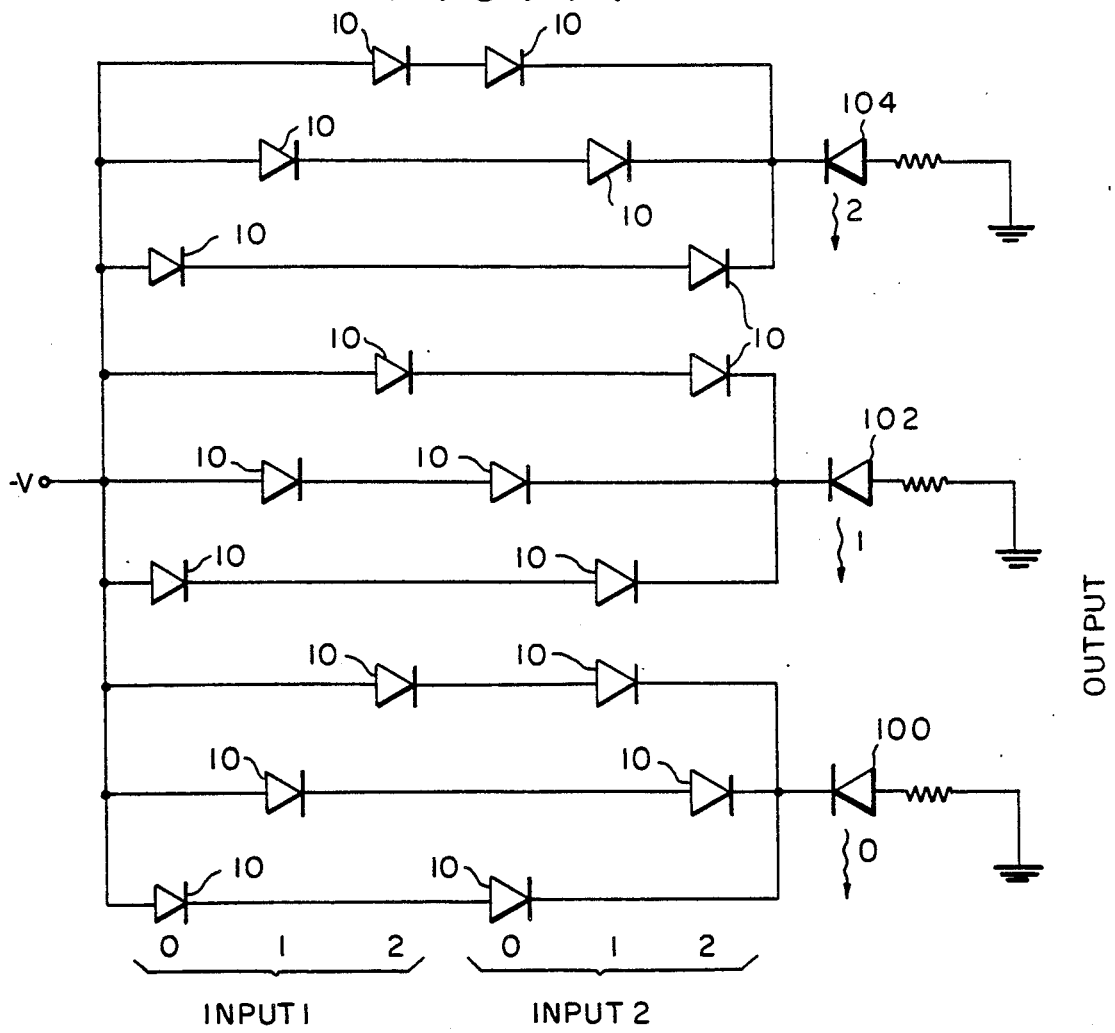
FIG. 14 is a schematic view of a residue 3 adder according to the present invention.

FIG. 14 shows a multiple level logic circuit implemented in accordance with the present invention. The circuit of FIG. 14 is a residue 3 adder. In this circuit, there are two inputs and one output. A one-of-many or positional notation is used.

Residue arithmetic is well known and will not be described in detail here. The two inputs of the adder of FIG. 14 each contain three lines indicated by 0, 1, and 2. These lines indicate the remainder of a number when divided by three. The output from electrical to optical conversions devices 100, 102 and 104 indicates the remainder of the sum of the numbers at inputs one and two after it is divided by 3.

Figure 15:
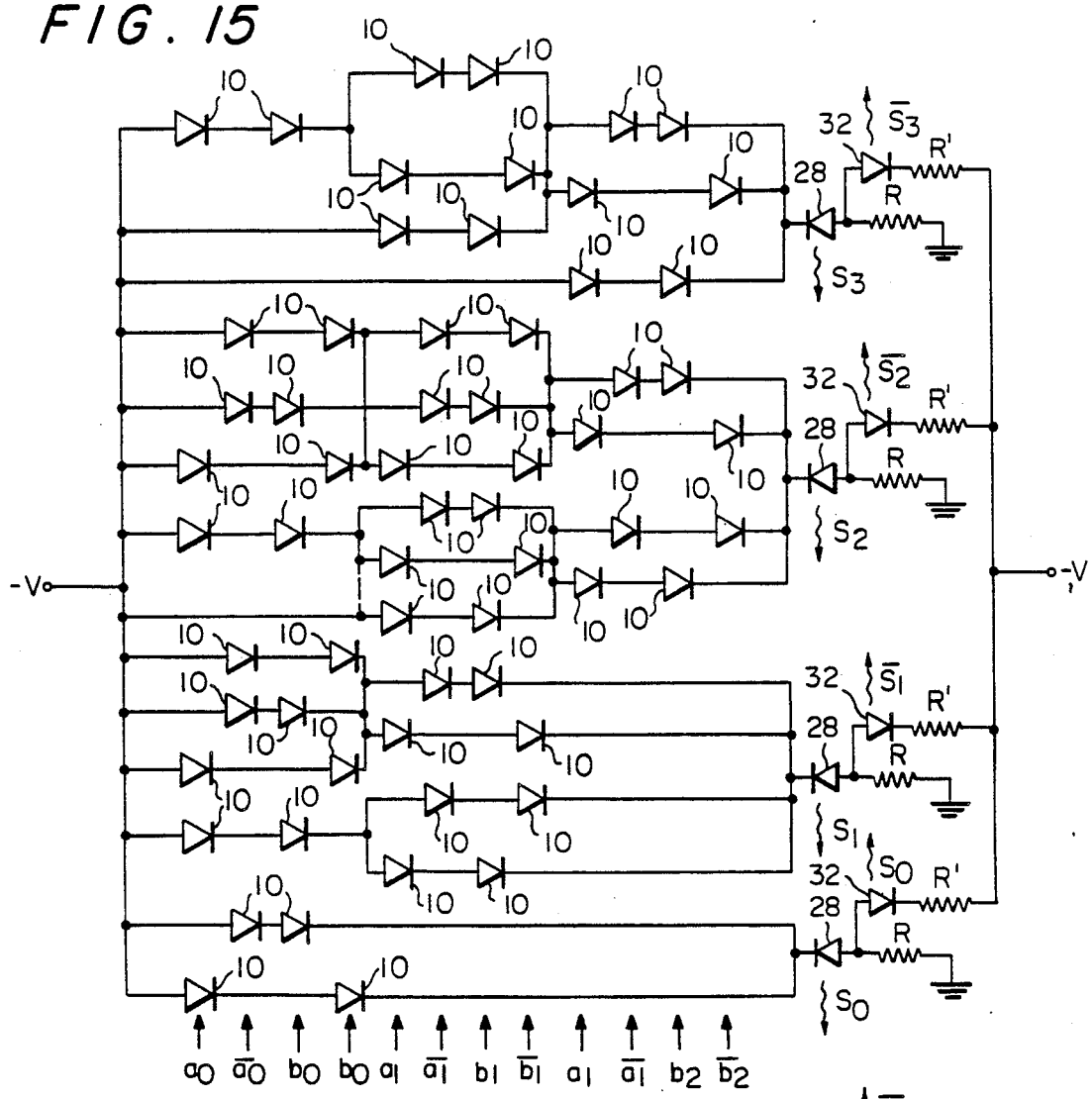
FIG. 15 is a schematic view of a 3 bit full adder according to the present invention.

FIG. 15 is a three bit full adder implemented in accordance with the present invention. The boolean equation for this adder is apparent from the circuit diagram. This adder will have a similar complexity for large bit numbers (32-64) as a residue system having similar range.

Figure 16:
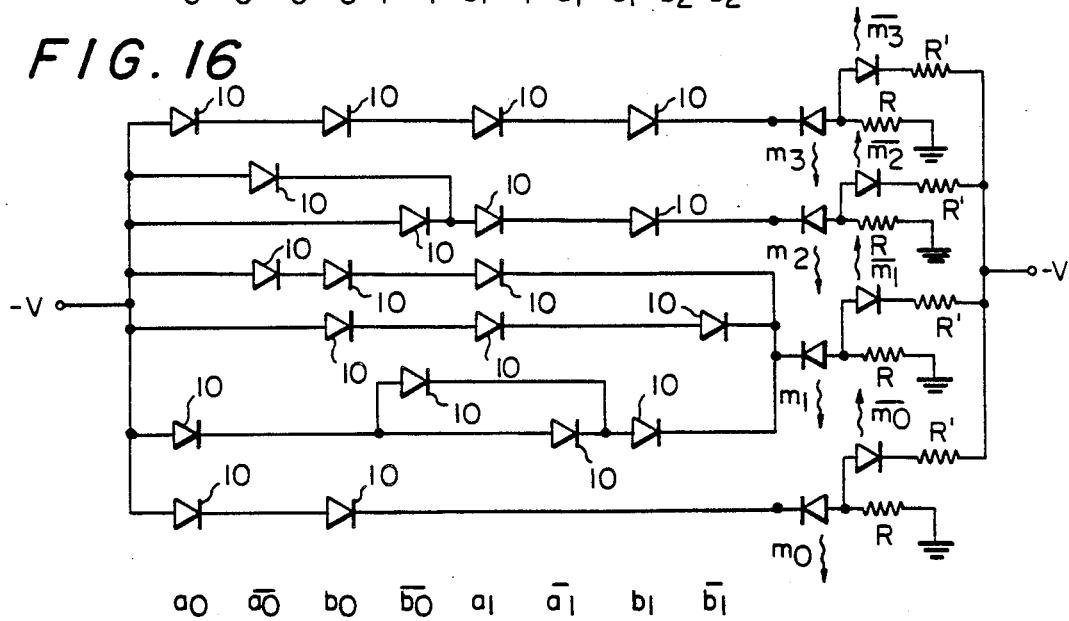
FIG. 16 is a schematic view of a 2 bit multiplier according to the present invention.

FIG. 16 is a two bit binary multiplies. Once again, the boolean equation for this circuit is apparent from the circuit itself and will not be discussed. This type of circuit can be expanded to accommodate larger numbers, but grows very large.

The foregoing description is intended to illustrate the present invention, but not to limit its scope. Clearly, numerous additions, substitutions and other changes could be made to the invention without limiting the scope thereof as set forth in the appended claims.

What is claimed is:
1. An apparatus, comprising:
   a semiconductor substrate;
   element defining means for defining a plurality of photoconductive elements in said semiconductive substrate;
   connecting means for connecting said photoconductive elements to form combinational logic gates;

light directing means positioned above said semiconductor substrate for directing light representing logic parameters to photoconductive elements of said logic gates;

wherein said combinational logic gates have complementary inputs and complementary outputs such that combinational logic can be carried out using only AND and OR gates.

2. An apparatus as claimed in claim 1 wherein said element defining means and said connecting means comprise a metallization layer over said semiconductor substrate.

3. An apparatus as claimed in claim 2 wherein said light directing means comprises an optical substrate having a plurality of waveguides over said metallization layer.

4. An apparatus as claimed in claim 3 wherein said waveguides include scattering patches positioned over certain of said photoconductive elements.

5. An apparatus as claimed in claim 1 wherein said element defining means comprises a pair of spaced metal electrodes having interdigitated fingers.

6. An apparatus as claimed in claim 5 wherein said metal electrodes are spaced by a distance of less than 5 microns.

7. An apparatus as claimed in claim 1 wherein said connecting means connects a plurality of said photoconductive elements in series to form an AND gate.

8. An apparatus as claimed in claim 1 wherein said connecting means connects a plurality of said photoconductive elements in parallel to form an OR gate.

9. An apparatus as claimed in claim 1 wherein said complementary outputs include paired light emitting elements.

10. An apparatus as claimed in claim 1 wherein said connecting means connects a plurality of said photoconductive elements to form a one bit full adder from only AND and OR gates.

11. An apparatus as claimed in claim 10 wherein said full adder comprises a first plurality of paths connected in parallel, each containing a set of series connected photoconductive elements, a second plurality of paths connected in parallel, each containing a set of series connected photoconductive elements, said light directing means passing light signal representing a first parameter to be added and it complement, a second parameter to be added and it complement, and a carry signal and its complement to said photoconductive elements.

12. An apparatus as claimed in claim 1 wherein said connecting means connects a plurality of said photoconductive elements to form a residue adder from only AND and OR gates.

13. An apparatus as claimed in claim 1 including means for generating complementary light signals to be directed by said light directing means.

14. An apparatus as claimed in claim 13 wherein said means for generating complementary light signals comprises a first electrical to optical signal transducer, a second electrical to optical signal transducer, and means for driving either one or the other of said electrical to optical signal transducers in dependence on an input signal.

15. An apparatus as claimed in claim 13 wherein said means for generating complementary light signals comprises an integrated optic switch.

16. An apparatus as claimed in claim 15 wherein said integrated optic switch is an X-crossing switch.

17. An apparatus as claimed in claim 16 wherein said integrated optic switch is a total internal reflectance (TIR) switch.

18. An apparatus as claimed in claim 17 wherein said means for generating complementary light signals is connected to produce complementary input signals for said combinational logic.

19. An apparatus as claimed in claim 14 wherein said means for generating complementary light signals is connected to produce complementary output signals in response to said combinational logic.

20. An apparatus as claimed in claim 1 wherein said light directing means includes inputs for parameters, complements of parameters and control signals, said control signals being directed to photoconductive elements in series with combinational logic gates to control their outputs.

21. An apparatus as claimed in claim 1 including control elements positioned to control the form of combinational logic to provide programmable combinational logic.

22. An apparatus as claimed in claim 21 wherein said control elements are photoconductive elements and wherein said light conducting means selectively directs light to said control elements to enable the form of said combinational logic to be altered.

23. An apparatus as claimed in claim 1 wherein said OR gates are formed by multiple optical inputs to one photoelectric element.

24. A method comprising:
in an optoelectric combinational logic circuit having photoelectric elements connected to form AND and OR gates,
illuminating said photoelectric elements with optical signals representing input parameters and their complements, and
producing output signals representing output parameters and their complements based on said combinational logic.

* * * * *